United States Patent [19]

Brower et al.

[11] 4,176,003
[45] Nov. 27, 1979

[54] METHOD FOR ENHANCING THE ADHESION OF PHOTORESIST TO POLYSILICON

[75] Inventors: Ronald W. Brower, Dayton; Jerome Cohen, Centerville, both of Ohio; Peter C. Chen, Sunnyvale, Calif.

[73] Assignee: NCR Corporation, Dayton, Ohio

[21] Appl. No.: 879,933

[22] Filed: Feb. 22, 1978

[51] Int. Cl.$^2$ ............... H01L 21/306; H01L 21/312; H01L 21/316
[52] U.S. Cl. ..................... 430/313; 156/657; 156/662; 156/668; 204/164; 427/38; 427/93; 427/294; 427/399; 156/643; 156/659.1
[58] Field of Search ............... 156/643, 652, 653, 657, 156/661, 662, 659, 646, 668; 427/38, 39, 44, 93, 294, 299, 314, 399, 407 R; 252/79.1; 204/164; 96/35.1

[56] References Cited

U.S. PATENT DOCUMENTS

| | | | |
|---|---|---|---|
| 3,880,684 | 4/1975 | Abe | 252/79.1 |
| 3,892,606 | 7/1975 | Chappelow et al. | 156/662 |
| 3,940,506 | 2/1976 | Heinecke | 427/38 |
| 4,026,733 | 3/1977 | Owen et al. | 156/662 |
| 4,103,064 | 7/1978 | McAlear et al. | 427/407 R |

OTHER PUBLICATIONS

Ligenza, J. R., "Silicon . . . Microwaves" *Journal of Applied Sciences*, vol. 36, No. 9 (Sep. 65), pp. 2703–2707.

*Primary Examiner*—Jerome W. Massie
*Attorney, Agent, or Firm*—J. T. Cavender; Lowell C. Bergstedt; Philip A. Dalton

[57] ABSTRACT

An adhesion-enhancing technique for preparing the surface of a polycrystalline silicon body to receive organic photoresist. In an exemplary procedure, the polysilicon is placed in an oxygen plasma chamber operating under rf power of about 90 milliwatts per cubic centimeter of chamber volume and a pressure of approximately 1 torr for 10 minutes to form an adhesion-enhancing oxide monolayer on the polysilicon.

6 Claims, 3 Drawing Figures

STEP 1
DEPOSIT SILICON NITRIDE LAYER

STEP 2
FORM ACTIVE AREA – DEFINING NITRIDE MASK

STEP 3
FORM FIELD OXIDE

STEP 4
REMOVE SILICON NITRIDE

STEP 5
FORM OXIDE LAYER

STEP 6
FORM POLYSILICON LAYER

STEP 7
TREAT POLYSILICON WITH OXYGEN PLASMA

STEP 8
FORM PR MASK

STEP 9
ETCH POLYSILICON AND OXIDE

METHOD FOR ENHANCING THE ADHESION OF PHOTORESIST TO POLYSILICON

FIELD OF THE INVENTION

This invention relates in general to the selective etching of semiconductor materials, and, more particularly, to a technique for enhancing the adhesion to polysilicon of photoresist material used to mask the polysilicon during etching.

BACKGROUND OF THE INVENTION

In a conventional technique for forming semiconductor devices by etching, a photoresist etching mask is formed on a surface of the body or layer to be etched. The pattern of the mask is chosen to protect preselcted areas from attack by the etchant species. Upon application of etchant to the surface, whether by wet chemical etching techniques, plasma etching techniques, etc., the etchant attacks and removes exposed portions of the surface, ideally leaving well-defined unetched area(s) coinciding with the area(s) covered by the mask.

Unfortunatly, resolution between etched and unetched areas is difficult to achieve at best, and is adversely affected by various etching parameters. Problems with resolution can be very difficult to solve and indeed can be a limiting factor in achieving the increasingly small, fine structures required by the microelectronics industry. In particular, photoresist adheres poorly to the silicon and polysilicon which is widely used in the microelectronics industry, with resulting poor etch resolution and the attendant problems with dimensional control, and wafer yields, device performance, etc.

One solution to the problem of photoresist-to-polysilicon adhesion is to use a different mask material. Probably the most widely used and best non-photoresist masking technique (in terms of adhesion) uses an oxide mask which is deposited or thermally grown on the polysilicon. One suitable procedure is to place the polysilicon body (typically a polysilicon coating on a partially processed semiconductor wafer) in a furnace at about 1000° C. in dry oxygen for about 1½ hours to thermally grow a 900 Angstroms thickness layer of silicon oxide out of the polysilicon. The relatively thick oxide layer is then formed to a mask for the polysilicon. The oxide provides a generally excellent mask for etching the polysilicon in wet chemical etchants such as a nitric acid-HF-acetic acid system.

It is believed oxide masks have not been used for plasma etching. Regardless of the etching technique used, the oxide masking procedure involves the combination of thermal growth, mask formation and mask removal and is thus time-consuming and relatively costly.

A different approach is to enhance the adhesion between polysilicon and photoresist by applying an intervening layer of hexamethyldisilazane (HMDS). This is a relatively simple operation, but the adhesion is still not great, as indicated by the characterization of sample Nos. 2A-2C in the Table below.

RF plasma techniques have been used to facilitate the etching of microelectronics materials. For example, U.S. Pat. No. 3,951,709 issued Apr. 20, 1976 to Jacob teaches the use of a plasma of oxygen and a chlorinated compound (halogen-containing compound) to etch a metallized material without degradation of the photoresist etching mask. U.S. Pat. No. 3,920,483 issued Nov. 18, 1975 to Johnson et al. relates to treating a preformed photoresist mask with plasma to prevent flowing of the photoresist material during subsequent ion implantation. U.S. Pat. No. 3,816,196 issued June 11, 1974 to LaCombe teaches a method of using plasma to passivate an organic photoresist to the effects of a subsequent plasma etch. As is evident, these patents relate to treating or otherwise affecting a photoresist mask after its formation on the material to be etched and do not relate to enhancing the adhesion between the photoresist and the masked body.

As may be thus appreciated, it is desirable to have a quick, simple technique for enhancing the adhesion of photoresist material to polysilicon.

SUMMARY OF THE INVENTION

The present invention relates to processes for etching silicon material such as polycrystalline silicon using organic photoresist masks. The invention is a technique for preparing the surface of the silicon to enhance the adhesion of organic photoresist material to the silicon surface during etching, and comprises subjecting the silicon surface to an oxygen plasma for a time sufficient to form at least a monolayer (in the order of 30 Angstroms) of silicon oxide on the silicon. Surprisingly, a thin oxide layer is sufficient to provide excellent adhesion of organic photoresist to the silicon.

DETAILED DESCRIPTION

Figure 1:
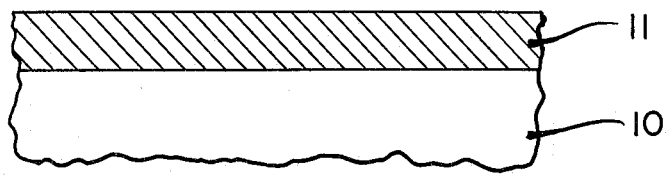
FIGS. 1 and 1A comprise a flow diagram illustrating an exemplary process for forming an insulated silicon gate field effect device, including the step of plasma oxidation of the silicon to enhance the adhesion of an etching mask thereto.
Figure 1:
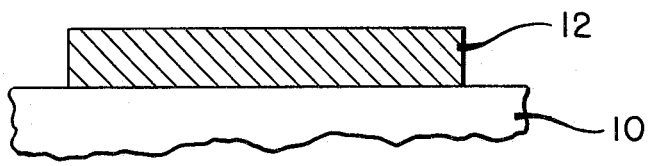
Figure 1:
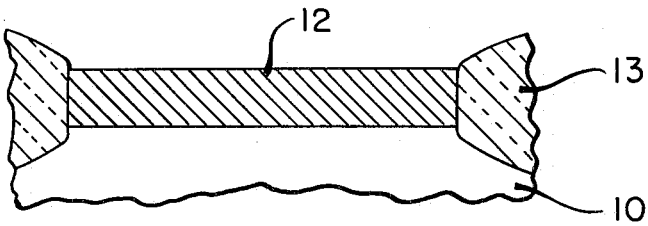
Figure 1:
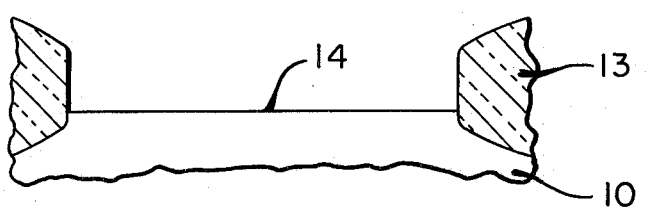
Figure 1:
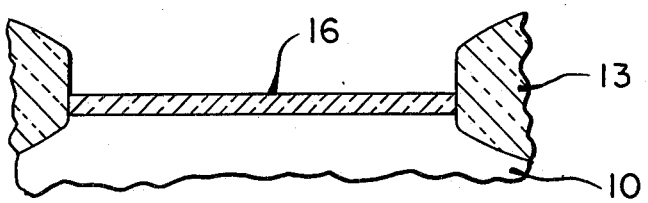
Figure 1:
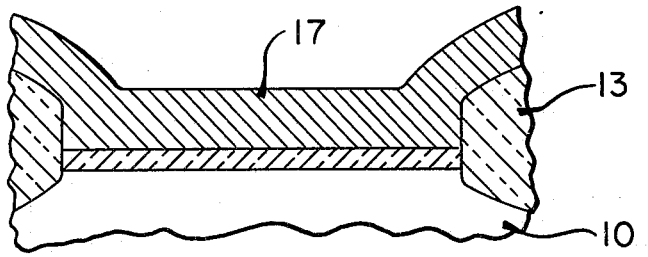
Figure 1:
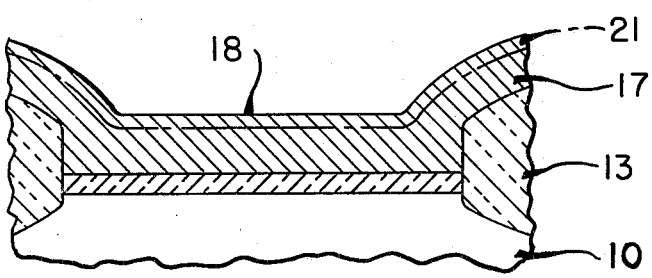
Figure 1A:
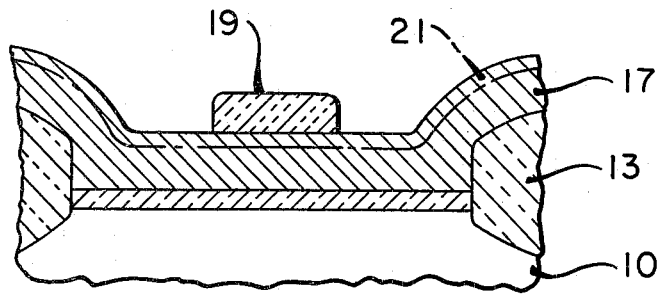

Referring now to FIGS. 1 and 1A, there is shown a typical sequence of steps for forming a silicon gate device to the point, step 9 (FIG. 1A), at which silicon gate electrode 45 is formed by etching in the presence of a photoresist mask 19. Such a silicon gate process, of course, is merely exemplary of various processes or structures which utilize photoresist (typically an organic photoresist) to mask as underlying layer or body of silicon during the etching of the silicon. The particular process is chosen to illustrate the particularly useful application to semiconductor device fabrication of the photoresist-to-silicon adhesion enhancement technique of the present invention. The invention is useful for enhancing the adhesion of polycrystalline silicon, monocrystalline silicon and amorphous silicon, although reference herein will be to the polycrystalline form (polysilicon).

The exemplary process comprises: forming a layer of silicon nitride 11 on a semiconductor wafer 10 (FIG. 1, step 1); selectively removing the silicon nitride layer 11, as by etching, to leave a mask 12 over the active device area (that is, over the subsequent location and shape of the combined source, gate and drain) (step 2); forming a thick oxide layer 13 on the substrate 10 about the sides of the nitride masking layer 12 (step 3); removing the silicon nitride masking layer 12 to leave the active device area 14 defined on the substrate by the oxide layer 13 (step 4); forming an oxide layer 16 on the active area (step 5); forming a polysilicon layer 17 on the oxide layers 13 and 16 (step 6); exposing the surface 18 of the polysilicon layer 17 to an oxygen plasma to form at least a thin oxide monolayer 21 at the surface (step 7); forming a photoresist mask 19 on the oxidized surface 18 of the polysilicon 17 above the gate region (FIG. 1A, step 8); and etching the polysilicon in the presence of the mask 19 to form the gate electrode 45. The underlying gate oxide layer 16 is then etched, using the photoresist 19 or the gate electrode 45 as an etching mask, to the desired shape of gate oxide 46.

The crucial step is step 7, in which the upper surface 18 of the polysilicon layer is oxidized in an oxygen plasma to form the thin layer 21 of oxide on the polysilicon upper surface. The oxygen plasma technique is used to provide a layer 21 which is very thin, too thin for accurate measurement, and as such comprises a mere monolayer of oxygen of approximately 30 Angstroms thickness. Despite being so thin, the oxide layer 21 provides excellent photoresist-to-silicon adhesion for etching of the silicon. Thicker layers 21 will also provide excellent photoresist-to-silicon adhesion. The especially surprising thing is that layer 21 can be very thin, a monolayer, and still provide excellent adhesion.

Figure 2:
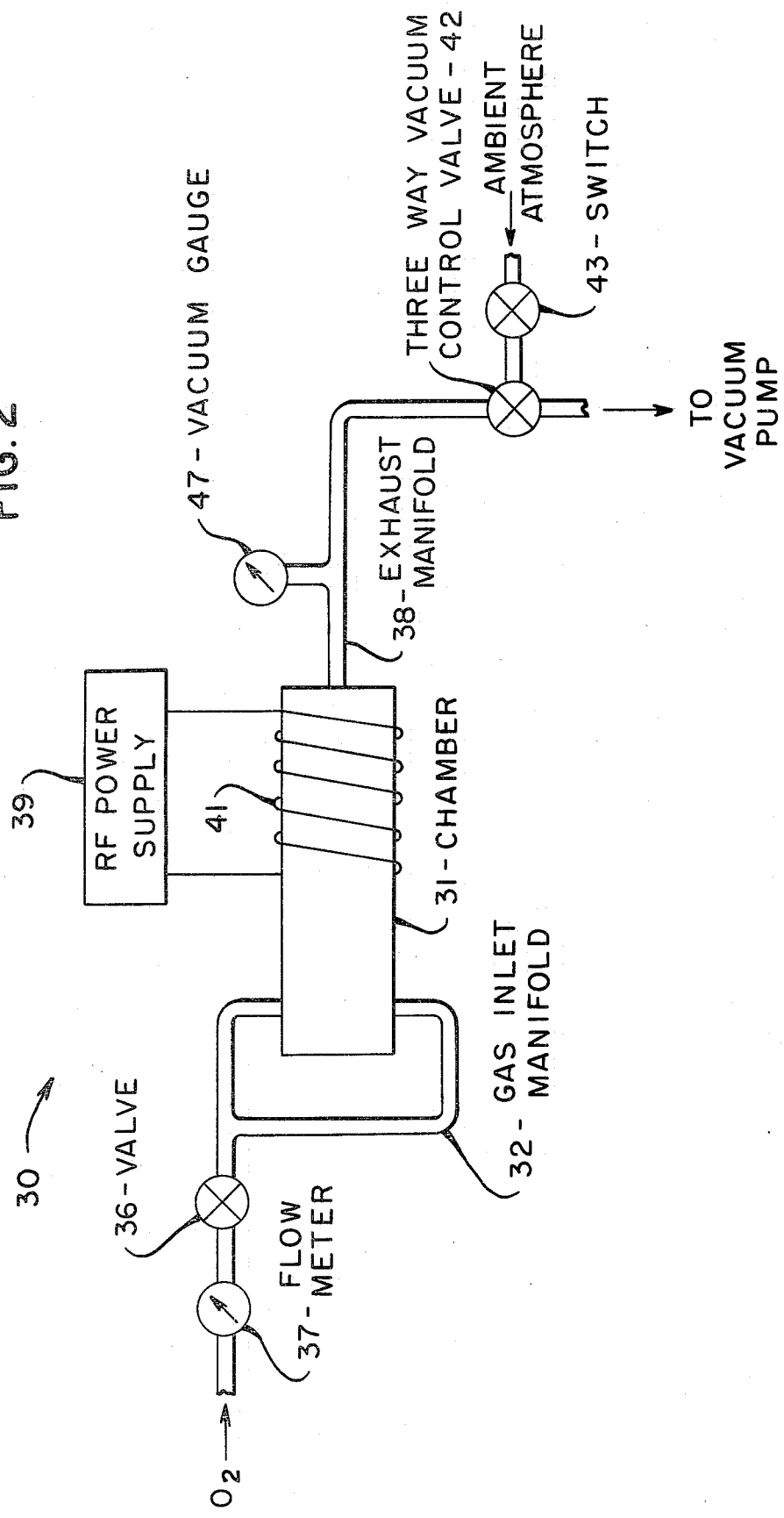
FIG. 2 is a diagrammatic illustration of apparatus suitable for plasma oxidation of silicon according to the present invention.

Referring now to FIG. 2, there is shown a plasma "ashing" system 30 suitable for practicing the adhesion enhancement technique of the present invention. The system 30 includes a reaction chamber 31 having a gas inlet manifold 32. A pressurized supply of oxygen (not shown) is connected to the gas inlet manifold for supplying oxygen to the chamber at a flow rate controlled by valve 36 and as indicated by vertical displacement of a glass ball in a flow meter 37. Gas exhaust manifold 38 connects at one end to the chamber and at the opposite end to a three-way valve 42 which selectively connects the chamber to a vacuum pump (not shown) or to the ambient atmosphere. Access to the ambient is controlled by a "fast switch" 43 which can be used to quickly restore the chamber to ambient pressure. Chamber pressure is indicated by vacuum gauge 47. A source of radio frequency power 39 provides RF power to the chamber 31 via coil 41.

In operation, and to oxidize the polysilicon layer 17 (step 7, FIG. 1), the polysilicon-coated wafer 10 is placed in the chamber 31 and the chamber is evacuated of air by the vacuum pump to a pressure of about one torr or $1.3 \times 10^{-3}$ atmospheres as indicated by gauge 47. As mentioned, connection of the vacuum pump to the stripping chamber 31 is controlled by valve 42. Commercial grade oxygen can be used, and is admitted to the chamber 31 at a low flow rate which is controlled by the valve 36 and indicated by the gas flow meter 37. The oxygen plasma is generated by coupling rf power of about 90 mw/cm$^3$ from the power supply 39 across the low pressure stream of flowing oxygen. Using the above parameters, the activated species of oxygen plasma oxidizes the polysilicon surface to form the requisite monolayer is about 10 minutes and at a low temperature (less than 300° C.) that precludes damage to the wafer.

It should be noted that chamber pressure and rf power density are the most important ones of the parameters. However, there is every reason to believe that a wide range of chamber pressures and rf powers can be used with successful results. For example, chamber pressures of 0.5 to 2.0 torr. have been used for the oxidation step with no apparent variation in photoresist adhesion. Nor is there reason to expect variation if this parameter were varied considerably more. Oxygen flow rate appears to be of importance primarily for its effect on chamber pressure. As mentioned, however, good adhesion is evidenced and expected for a wide range of chamber pressures. In short, the important thing is that an oxygen plasma system be used which is capable of forming at least a monolayer of oxide on polysilicon.

A suitable plasma system which includes the features shown in FIG. 2 is the Model No. LTA-302 plasma asher available from LFE Corporaton, 1601 Trapelo Road, Waltham, Massachusetts 02154.

In step 8 (FIG. 1A), the photoresist mask 19 is formed on the oxidized polysilicon layer 17. Typically, the mask is an organic photoresist, such as Waycoat Type 3. To form Waycoat Type 3 to the desired configuration, the liquid photoresist is applied to the polysilicon surface 18; baked to release solvents; exposed through a mask (Waycoat Type 3 is negative and exposure to ultraviolet radiation renders the exposed portions insoluble in the developing medium); developed to remove the unexposed areas and form the etching mask 19 to a predetermined pattern; and post-baked to increase the hardness of the formed photoresist mask.

In step 9, initially the polysilicon layer 17 is etched in the presence of the mask 19 to the shape of the gate electrode 45. The polysilicon can be plasma-etched at this stage using a technique similar to that described for oxidation, step 7, but using freon as an etchant gas rather than oxygen.

To complete the gate formation, the oxide layer 16 can be etched in the presence of the mask 19 to the shape of the gate oxide 46. Alternatively, mask 19 can be removed and the polysilicon gate electrode 45 can be used as the etch mask. It is one of the advantages of the present invention that the photoresist mask can be removed using the same oxide plasma ashing technique employed for the adhesion-enhancing pretreatment, step 7. Typically, the oxide is removed by applying a standard 1:7 mixture of hydrofluoric acid (HF) in ammonium fluoride (NH$_4$F).

If not removed prior to the formation of the gate oxide 46, the mask 19 is conveniently removed at this point.

Figure 3:
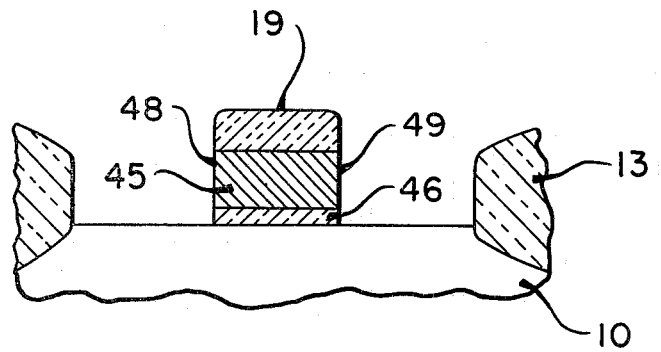
FIG. 3 is a cross-sectional view taken parallel to the channel of a silicon gate field effect device representative of a class of devices whose manufacture is facilitated by application of the process of the present invention.
Figure 3:
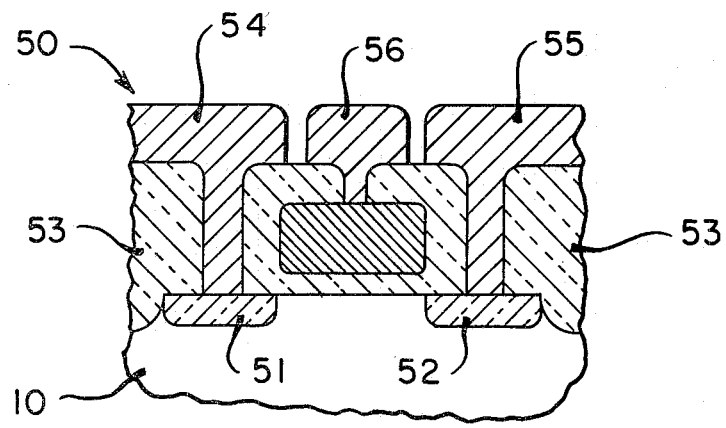

Referring now to FIG. 3, the structure shown in step 9, FIG. 1A can be completed to a silicon gate field effect transistor 50. Of course, it will be appreciated that the improved adhesion provided by the present invention is applicable to not only this structure, but wherever enhanced adhesion of photoresist, particularly organic photoresist to polysilicon is desired. The device 50 is typically completed to the form shown in FIG. 3 by forming source 51 and drain 52 in the substrate; forming additional insulation 53 as needed over the source and drain; etching openings through the insulation; and forming source, drain and gate contacts 54, 55, and 56, respectively. The conductivity of the gate silicon electrode 19 can be enhanced by doping the electrode during the formation of the source and drain. Also, an additional conducting layer of material (not shown) may be applied to the electrode to enhance electrical contact. A passivating layer (not shown), and various connections and interconnections (not shown) may be applied to the device as required. Also, the gate and/or the field regions of the substrate may be doped during the fabrication process to control the threshold voltage and eliminate parasitic conduction paths.

EXAMPLES

Adhesion provided by the process of the present invention was compared to adhesion provided by prior art pretreatment techniques. To do this, semiconductor wafers were prepared as described in steps 1–6 and were then treated, as summarized in the Table, as follows:

Sample 1 received no adhesion-enhancing pretreatment. Waycoat Type 3 photoresist was applied directly to the polysilicon using the step 8 procedure.

Sample Nos. 2A–2C were pretreated using a 20:1 mixture of HMDS in xylene. The mixture was squirted onto the polysilicon surface, then the wafer was spun (to promote a uniform coating) until the mixture was dry, and Waycoat Type 3 photoresist was applied as described per step 8.

Sample 3 was treated in the same manner as Samples 2, except that full strength HMDS was used.

Samples 4A–4C were subjected to the oxygen plasma pretreatment of step 7 using 0.50, 0.75, and 2.00 torr. oxygen pressure respectively. Waycoat photoresist was applied in the same manner as for Samples 1–3.

TABLE

| SAMPLE | PRE-MASK TREATMENT | MASK | PLASMA PRESSURES OXYGEN (OXIDATION) | FREON (ETCH) | MASK-SILICON ADHESION |
|---|---|---|---|---|---|
| 1 | None | Waycoat | — | 2.0 torr. | Poor |
| 2A | 20:1 Xylene:HMDS | " | — | 1.5 torr. | Poor |
| 2B | 20:1 Xylene:HMDS | " | — | 2.0 torr. | Poor |
| 2C | 20:1 Xylene:HMDS | " | — | 2.5 torr. | Poor |
| 3 | 100% HMDS | " | — | 2.0 torr. | Poor |
| 4A | Oxygen Plasma | " | 0.50 torr. | 2.0 torr. | Good |
| 4B | " | " | 0.75 torr. | 2.0 torr. | Good |
| 4C | " | " | 2.00 torr. | 2.0 torr. | Good |

The Waycoat-masked samples were then put in a plasma etcher and the polysilicon was etched using a procedure similar to that described for oxidation, step 7, with freon used in place of oxygen. The arrangement of the etcher system can be the same as that shown in FIG. 2 for the oxide plasma asher. One suitable technique uses freon flowing at about 2 cm. as indicated by flow meter 37, rf power of 350 watts (20 milliwatts per cubic centimeter of chamber volume) and a chamber pressure of 1.5–2.5 torr. The system was Model No. PDE 301, which is manufactured by the aforementioned LFE Corporation. This etcher system is sufficiently versatile that it may be used for oxidation (step 7) as well as for etching (step 9) and mask removal.

Poor mask-to-polysilicon adhesion and good adhesion cause different, perceivable characteristics in the etched polysilicon. For poor adhesion, etching tends to be a diffusion limited process, with migration of the etchant species occurring at the interface between the polysilicon and the photoresist. The result is continuous lateral etching. The slope of the etch wall about the mask tends to be at a constant angle, i.e., the wall slope tends to be linear. In contrast, when there is strong, tight adhesion between the polysilicon and the photoresist, etching tends to be an activation-limited process which is limited by the availability of the etchant species. In this case the etch wall tends to be curved, typically with a cylindrical or concave profile.

Electron micrographs were obtained of vertical cross-sections of the samples taken perpendicular to the plane of the polysilicon. These cross-sections were analogous to the cross-sections shown in FIG. 1. The profile of the etch wall (walls 48 and 49 in step 9) and the quality of adhesion was determined by characterizing the profile as linear or curved, i.e., as indicating poor or good adhesion. As indicated in the Table, Sample No. 1, which received no pretreatment, and Samples 2A–2C and 3, which received the HMDS pretreatment, exhibited poor adhesion. In contrast, the plasma oxidized Samples 4A–4C all exhibited excellent adhesion. The adhesion of Samples 4A–4C was uniformly excellent although the oxygen chamber pressure was varied over the range 0.50 to 2.00 torr. The consistency of adhesion within the sample grouping was taken as proof that the oxygen plasma oxidation pretreatment per se, and not the specific parameters in the oxidation treatment, was the determining factor in the quality of adhesion.

Thus, there has been described a quick, relatively economic method of increasing the adhesion of organic photoresist to polysilicon.

Having described preferred and alternative applications of the invention, what is claimed is:

1. An improved process for etching a layer of silicon in the presence of an organic photomask adhered to the surface of the silicon, comprising:
    forming a monolayer of oxide on the silicon by subjecting the silicon surface to an oxygen plasma;
    forming the organic photomask on the silicon oxide; and
    etching the masked silicon surface in freon plasma.

2. The improved etching process of claim 1 wherein the silicon is polycrystalline silicon.

3. The improved etching process of claim 1 wherein the oxygen plasma is applied to the silicon for about ten minutes in a low pressure gas plasma chamber operating at rf power of about 90 milliwatts per chamber cubic centimeter.

4. A process for etching a polysilicon surface comprising:
    subjecting the surface in a vacuum chamber to an oxide plasma provided by rf power of about 90 milliwatts per chamber cubic centimeter operating on oxygen flowing in an ambient pressure of about 0.5–2.0 torr to form a monolayer of silicon oxide on the surface;
    forming an organic photoresist to a predetermined masking pattern on the polysilicon surface; and
    etching the polysilicon surface in a vacuum chamber in the presence of the photoresist mask by exposing the masked polysilicon surface to a freon plasma generated by rf power of about 20 milliwatts per chamber cubic centimeter operating on freon flowing in an ambient pressure of about 1.5–2.5 torr.

5. The process of claim 1 or 4 wherein the oxygen plasma oxidation technique is employed after the etching step to remove the photoresist.

6. The process for etching a polysilicon surface according to claim 4, wherein the chamber used for oxidizing the polysilicon surface is used for etching the surface.

* * * * *